(12) United States Patent
Lee

(10) Patent No.: US 6,214,751 B1
(45) Date of Patent: Apr. 10, 2001

(54) METHOD FOR FORMING THIN FILM IN FABRICATING SEMICONDUCTOR DEVICE

(75) Inventor: Soo-hwan Lee, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/280,847

(22) Filed: Mar. 30, 1999

(30) Foreign Application Priority Data

Mar. 31, 1998 (KR) .................................................. 98-11337

(51) Int. Cl.$^7$ ...................................................... H01L 21/00
(52) U.S. Cl. ............................ 438/800; 438/905; 118/725
(58) Field of Search ........................................ 438/800, 149, 438/166, 308, 514, 905; 118/215, 715, 725, 733

(56) References Cited

U.S. PATENT DOCUMENTS

| 5,425,812 | * | 6/1995 | Tsutahara et al. | .................... 118/725 |
| 5,503,882 | * | 4/1996 | Dawson | ................................ 427/579 |
| 5,925,212 | * | 7/1999 | Rice et al. | ............................ 156/204 |

FOREIGN PATENT DOCUMENTS 8-31750    2/1996   (JP) .

* cited by examiner

*Primary Examiner*—David Nelms
*Assistant Examiner*—Phuc T. Dang
(74) *Attorney, Agent, or Firm*—Jones Volentine, LLC

(57) ABSTRACT

A method of forming a thin film on a plurality of wafers stored in a wafer cassette does not require cleaning the reaction chamber(s) after each thin film formation step. The reaction chamber cleaning is performed after the thin film formation process is performed consecutively at least two times.

9 Claims, 2 Drawing Sheets

METHOD FOR FORMING THIN FILM IN FABRICATING SEMICONDUCTOR DEVICE

BACKGROUND OF THE INVENTION

1. Field of the Invention

The present invention relates to a method for fabricating a semiconductor device, and more particularly, to a method for forming a thin film.

2. Description of the Related Art

The efficiency with which semiconductor devices are manufactured is a function of each and every process performed during manufacture. In other words, if the time required to complete one manufacturing process is reduced, the overall manufacturing efficiency is improved.

Many of the manufacturing processes performed during the fabrication of a semiconductor device take place in a reaction chamber. The transit time for wafers, or for a sheet of wafers, hereafter referred to as "wafers," to and from the reaction chamber, as well as the preparation time of the reaction chamber itself, all contribute to the processing time. As an example, a conventional batch process used to form a thin film on a number of wafers will now be described.

To begin the process, a batch of wafers is loaded into a wafer cassette. From the wafer cassette, wafers are transferred one after the other into a reaction chamber by a storage elevator. Once a first wafer is in the reaction chamber a thin film is formed, following which the wafer is removed and returned to the wafer cassette via the elevator. After removing the first wafer, the reaction chamber is cleaned. Once the reaction chamber is cleaned, a second wafer is carried from the wafer cassette by the elevator to the reaction chamber. The process thus repeats throughout the stack of wafers in the wafer cassette.

Of note, the conventional thin film forming process requires that the reaction chamber be cleaned following thin film formation on each wafer. However, since as many as 25 wafers (plus one additional test wafer) may be loaded into a wafer cassette for any given thin film process batch, the reaction chamber must be cleaned, using conventional technology, 25 times.

Table 1 shows a conventional cleaning recipe for the reaction chamber when the thin film formed in the reaction chamber is a plasma enhanced oxide film.

TABLE 1

| Item | | 1K | 1.5K | 2.5K | 4K | | |
|---|---|---|---|---|---|---|---|
| Step | 1 | 2 | 2 | 2 | 2 | 3 | 4 |
| Activity | Set flow | Clean | Clean | Clean | Clean | Purge | Pump |
| Step control factor | Time | Time | Time | Time | Time | Time | Time |
| Time(sec) | 5 | 20 | 30 | 40 | 50 | 10 | 20 |
| Pressure (mT) | 5 | 5 | 5 | 5 | 5 | open | open |
| RF(W) | 0 | 800 | 800 | 800 | 800 | 0 | 0 |
| Temperature | 0 | 0 | 0 | 0 | 0 | 0 | 400 |
| Space (mils) | 600 | 600 | 600 | 600 | 600 | 600 | 600 |
| $N_2O$ | 550 | 550 | 550 | 550 | 550 | 0 | 0 |
| $CF_4$ | 1750 | 1750 | 1750 | 1750 | 1750 | | |
| $N_2$ | 0 | 0 | 0 | 0 | 0 | 2000 | 0 |

As can be seen from the Table 1, cleaning of the reaction chamber consists of four steps. The first step is a set flow step, the second step is a cleaning step, and the third and fourth steps are purge and pump steps, respectively. The controlling factor for each step is time. The first step takes about 5 seconds, the second step between 20 and 50 seconds, depending on the thickness of the oxide film formed, the third 20 and fourth steps take about 10 and 20 seconds, respectively. With these process steps, the air pressure during the first and second steps remains uniform at about 5 mTorr, but during the third and fourth steps pressure within the reaction chamber is arbitrarily adjusted according to the specific purge or pumping steps.

Further, the induced power (RF) is zero during the first, third and fourth steps, but is 800 Watts during the second step. The temperature is maintained at 0° C. during the first, second, and third steps, and increased to 400° C. during the fourth step. Space refers to the distance a susceptor, on which a wafer is loaded, is moved up and down, and this space remains uniform at 600 mils throughout the cleaning process.

The gases induced into the reaction chamber during the cleaning process are $N_2O$, $CF_4$ and $N_2$. In particular, $N_2O$ and $CF_4$ are induced during the first and second steps. $N_2$ is induced during the third step. $N_2O$ is induced to 550 sccm (standard cubic cm), $CF_4$ is induced to 1750 sccm, and $N_2$ is induced to 2000 sccm.

In Table 1, four possible second steps are specified. The choice between these four possible second steps, labeled 1K, 1.5K, 2.5K and 4K, is made in relation to thickness of the thin film previously formed in the reaction chamber.

As described above, the conventional, four step reaction chamber cleaning process is performed following the formation of a thin film on each wafer, as it is sequentially placed in the reaction chamber from a wafer cassette. Thus, the four cleaning steps are performed a number of times, depending on the number of wafers in the batch. Also, as shown in Table 1, since about 55 to 85 seconds are required to complete the four cleaning steps, about 22.95 to 35.42 minutes are required to clean the reaction chamber during a batch process of 25 wafers loaded in a wafer cassette. Again, this is only the cleaning time for the reaction chamber.

This is a considerable amount of time. A significant reduction in cleaning time would increase overall manufacturing efficiency.

SUMMARY OF THE INVENTION

The present invention provides a method for forming a thin film on wafers during the manufacture of semiconductor devices having a dramatically reduced cleaning time for the reaction chamber in which a thin film forming process is performed.

In one aspect, the present invention provides a method for forming a thin film on a plurality of wafers stored in a wafer cassette; the method comprising, (a) loading a first wafer from the wafer cassette into a reaction chamber, (b) forming a thin film on the first wafer, (c) returning the first wafer to the wafer cassette following formation of the thin film, (d) repeating (a) through (c) for at least a second wafer in the wafer cassette, and (e) cleaning the reaction chamber.

Further, the method is well adapted for use in a multi-reaction chamber device. The thin film may be a plasma enhanced oxide film.

In another aspect, (a) through (c) above are repeatedly performed at least twice and preferably up to nine times for wafers selected from the wafer cassette. However, when a multi-reaction chamber is in use, (e) above may be performed well before nine wafers.

In yet another aspect, (e) above further comprises; establishing a first set flow, cleaning the reaction chamber, over-etching, performing a first purging, performing a first pumping, establishing a second set flow, performing a coating, performing a second purging, and performing a second pumping.

BRIEF DESCRIPTION OF THE DRAWINGS

The advantages of the present invention will become more apparent upon consideration of a preferred embodiment with reference to the attached drawings in which:

Table 2 shows a process recipe for cleaning the reaction chamber according to the present invention after the formation of multiple thin films. In this example, the thin film formed on the wafers in the reaction chamber is a plasma enhanced oxide film.

Figure 2:
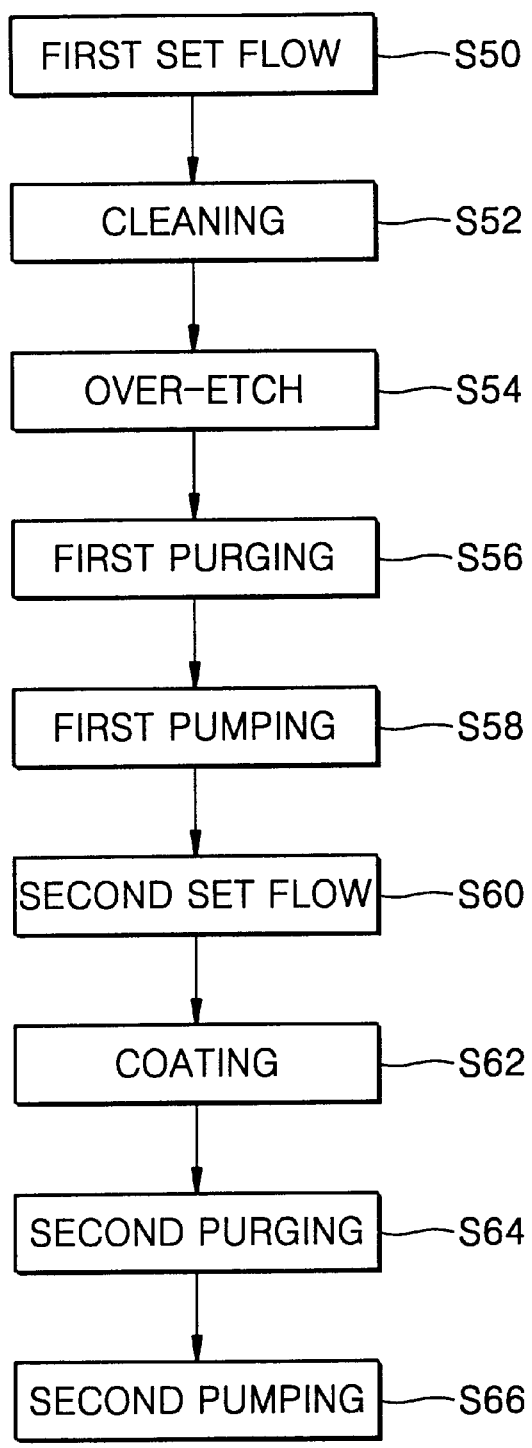

Referring to Table 2 and FIG. 2, the reaction chamber cleaning comprises up to nine steps: a first set flow, a cleaning, an over-etch, a first purging, a first pumping, a second set flow, a coating, a second purging, and a second pumping. The controlling factor for each of these steps is time.

TABLE 2

| Step | 1 | 2 | 3 | 4 | 5 | 6 | 7 | 8 | 9 |
|---|---|---|---|---|---|---|---|---|---|
| Activity | 1st set flow | Clean | Over-etch | 1st purge | 1st pump | 2nd set flow | Coat | 2nd purge | 2nd pump |
| Step control factor | Time | Time | Time | Time | Time | Time | Time | Time | Time |
| Time(sec) | 10 | 250 | 25 | 10 | 20 | 5 | 30 | 50 | 5 |
| Pressure (mT) | 5 | 5 | 5 | open | open | 2.8 | 2.8 | 2.8 | open |
| RF(W) | 0 | 800 | 800 | 0 | 0 | 0 | 190 | 0 | 0 |
| Temperature (° C.) | 0 | 0 | 0 | 400 | 400 | 390 | 390 | 390 | 400 |
| Space (mils) | 600 | 600 | 600 | 600 | 600 | 400 | 400 | 400 | 400 |
| $N_2O$ | 550 | 550 | 550 | 0 | 0 | 1800 | 1800 | 0 | 0 |
| $CF_4$ | 1750 | 1750 | 1750 | 0 | 0 | 90 | 90 | 0 | 0 |
| $N_2$ |  |  |  | 2000 |  |  |  | 2000 |  |

Figure 1:
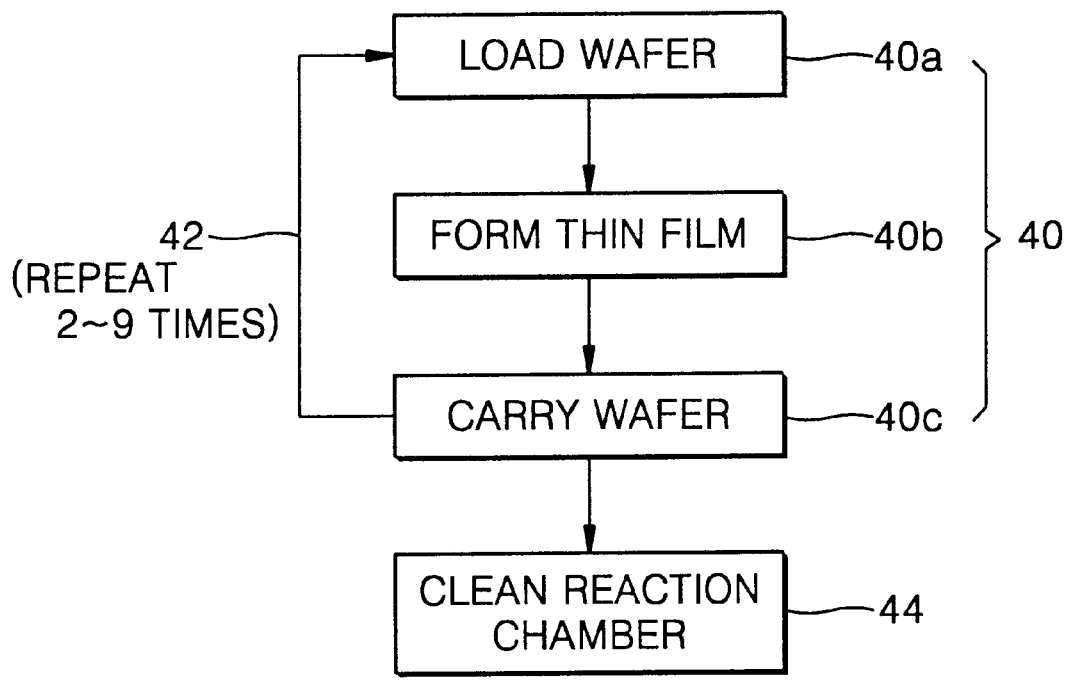

FIG. 1 is a flow chart illustrating a method for forming a thin film in a semiconductor manufacturing process according to the present invention; and FIG. 2 is a flow chart illustrating the cleaning process according to the present invention.

DESCRIPTION OF THE PREFERRED EMBODIMENT

A method of forming a thin film on a wafer during the manufacture of a semiconductor device according to the present invention will now be described with reference to the accompanying drawings. Referring to FIG. 1, the exemplary thin film formation method shown comprises forming a thin film on a wafer 40, and cleaning the reaction chamber 44.

In some additional detail, the step of forming a thin film comprises loading a wafer into the reaction chamber from a wafer cassette (40*a*), forming a thin film on the wafer in the reaction chamber (40*b*), and carrying the wafer on which the thin film is formed to the wafer cassette (40*c*). In the example, the thin film formed on the wafer is an oxide layer, preferably a plasma enhanced oxide film.

Of note, in the exemplary method, the reaction chamber cleaning 44 is not performed after formation of each thin film 40. Rather, the formation of a thin film on a wafer is performed at least twice 42 before the reaction chamber is cleaned 44. More particularly, the reaction chamber is cleaned 44 only after thin film formation is performed about 9 times. In other words, only after the thin film forming process is consecutively performed at least twice, and preferably 9 times in the reaction chamber, will the reaction chamber thereafter be cleaned. As a result, since the reaction chamber is cleaned only after at least two and up to nine thin film formation processes have been performed, the number of reaction chamber cleanings is dramatically reduced.

Referring to Table 2 and FIG. 2, the first set flow (S50) forms an atmosphere in the reaction chamber for cleaning the reaction chamber, and is performed under a pressure of 5 mTorr for about 10 seconds. Here, the temperature is maintained at 0° C. without RF power being applied. The space is about 600 mils. About 550 sscm of $N_2O$ gas and 1750 sccm of $CF_4$ gas are flowed into the reaction chamber.

Next, the reaction chamber cleaning (S52) is performed. This is done at a pressure of 5 mTorr for about 250 seconds. Here, the temperature is maintained at 0° C. with 800 Watts of RF power being applied. The space and the amounts of $N_2O$ gas and $CF_4$ gas flowed into the reaction chamber are the same as those in the first set flow (S50). Cleaning ends only when a preset ending point is detected. However, even where the ending point is detected for the cleaning prior to a predetermined time period, as in the case of cleaning material layers, cleaning continues for the predetermined time in order to fully clean the reaction chamber prior to over-etching.

Referring to Table 2, over-etching (S54) is performed under a pressure of 5 mTorr for about 25 seconds, which is shorter than the cleaning step (S52). The other conditions are the same as those in the cleaning step (S52).

The first purging (S56) exhausts the reaction byproducts generated in the previous steps, and is performed for about 10 seconds. The pressure is not specifically set, unlike the previous steps. That is, the pressure may vary depending on circumstances. RF power is not applied, the temperature is maintained at about 400° C., and the space is about 600 mils. Also, the flow of $N_2O$ gas and $CF_4$ gas into the reaction chamber is stopped and 2000 sccm of $N_2$ gas is flowed into the reaction chamber.

The first pumping (S58) adjusts the pressure in the reaction chamber to a desired level. In this step, the pressure is not specifically set. That is, the pressure of the reaction chamber can be adjusted to a desired level by pumping. To this end, no gas is supplied to the reaction chamber, but the N₂ gas flowed into the reaction chamber in the previous steps is exhausted. The first pumping is performed for about 20 seconds. Here, the temperature and space are 400° C. and 600 mils, respectively.

After performing the first pumping, the second set flow (S60) is performed which forms an atmosphere for pre-coating the primarily pumped reaction chamber. The second set flow is performed under a pressure of about 2.8 mTorr for about 5 seconds. Without RF power being applied, the temperature is maintained at about 390° C. and the space is about 400 mils. About 1800 sccm of N₂O gas and 90 sccm of CF₄ gas are flowed into the reaction chamber for about 5 seconds.

Coating (S62) is performed under a pressure of about 2.8 mTorr for about 30 seconds. Here, 190 W of RF power is applied. The other conditions of coating are the same as those in the second set flow.

The second purging (S64) exhausts reaction byproducts generated in the previous steps. To this end, without N₂O gas and CF₄ gas flowing into the reaction chamber, 2000 sccm of N₂ gas is flowed into the reaction chamber. The second purging is performed under a pressure of 2.8 mTorr for about 50 seconds. Here, RF power is not applied, and the temperature and the space are the same as those used in coating.

The second pumping (S66) is performed for the same purpose as the first pumping (S58), and is performed for about 5 seconds. The other conditions are the same as those in the first pumping.

As described above, the reaction chamber cleaning 44 is performed only after performing the thin film forming process on at least two wafers, that is, at least two wafers of all the wafers loaded into the wafer cassette. Thus, assuming a standard rack of 25 wafers, the reaction chamber is cleaned from between 1 and 13 times.

Typically, the reaction chamber system is a multi-chamber system. One common type of reaction chamber actually includes three separate chambers for forming a thin film on wafers. Again, assuming 25 wafers are loaded on the wafer cassette, and recognizing that the only up to 9 wafers can be processed before reaction chamber cleaning becomes necessary, it is clear that repeated cleaning is required for a stack of wafers in a single wafer cassette. Thus, the cycle for performing the necessary reaction chamber cleaning 44 will differ and the wafer throughput for the reaction chamber will vary accordingly.

EXAMPLE 1

Changes in the wafer throughput and productivity of the reaction chamber were observed, according to various cycles for performing reaction chamber cleaning 44. Here, the reaction chamber system used was a multi-chamber system, including 3 reaction chambers. Also, the thin film formed on the wafers was a plasma enhanced oxide film. The plasma enhanced oxide film was formed to a thickness of 4 K.

The following Table 3 shows wafer throughput for the reaction chamber in cases where the reaction chamber cleaning was performed after 1, 4, 5, 9 and 11 wafers, respectively.

TABLE 3

| Cleaning cycle | 1X | 4X | 5X | 9X | 10X | 11X |
| --- | --- | --- | --- | --- | --- | --- |
| Wafers/hour | 37 | 45.4 | 48.8 | 57.9 | 56 | 55 |
| Increase in Productivity | | 22.7% | 31.9% | 56.5% | 51.4% | 48.6% |

Referring to Table 3, when the reaction chamber cleaning cycle was every 1, 4, 5, 9, 10 and 11 wafers, the wafer throughput of the reaction chamber per hour were 37, 45.4, 48.8, 57.9, 56 and 55, respectively. In other words, the wafer throughput of the reaction chamber was highest when the reaction chamber cleaning 44 was performed for every 9 wafers.

Increases in productivity for reaction chamber cycles of 4, 5, 9, 10 and 11 wafers increased 22.7%, 31.9%, 56.5%, 51.4% and 48.6%, respectively, when compared to a reaction chamber cleaning after wafer. Beyond a cleaning cycle of 9 wafers, performance, as measured by wafer throughput did not increase. Further, it is understood that wafer throughput at the reaction chamber is proportional to an increase in the productivity of semiconductor devices. As a result, maximum productivity is realized for a reaction chamber cleaning cycle of 9 wafers.

EXAMPLE 2

In this example, the reaction chamber cleaning 44 was performed between thin film formation processes which formed thin films having thicknesses of 1K, 1.5K, 2.5K, and 4K. The other conditions of Example 2 were the same as those of Example 1.

In Table 4, PEOX 1K, PEOX 1.5K, PEOX 2.5K and PEOX 4K represent processes for forming a thin film, i.e., plasma enhanced oxide film (PEOX), to thicknesses of 1K, 1.5K, 2.5K and 4K, respectively. Also, 1×, 4×, 5× and 9× represent cycles of performing the reaction chamber cleaning 44, which means that the reaction chamber cleaning 44 is performed after every 1, 4, 5 and 9 wafers, respectively.

TABLE 4

| Film Thickness Cleaning cycle | PEOX 1K | PEOX 1.5K | PEOX 2.5K | PEOX 4K |
| --- | --- | --- | --- | --- |
| 1X | 50 | 45 | 42 | 37 |
| 4X | 65 | 60 | 55.7 | 45.4 |
| 5X | 70 | 65 | 62.4 | 48.8 |
| 9X | 75 | 71 | 67.8 | 57.9 |

Referring to Table 4, when the reaction chamber cleaning 44 was performed after a process of forming the PEOX to a thickness of 1K, the wafer throughput for the reaction chamber per hour was 50, 65, 70 and 75 for cases where the reaction chamber cleaning 44 was performed after 1×, 4×, 5× and 9×, respectively. When the reaction chamber cleaning 44 was performed after a process of forming the PEOX to a thickness of 1.5K, wafer throughput was 45, 60, 65 and 71 per hour for cycles 1×, 4×, 5×, and 9×. When the reaction chamber cleaning 44 was performed after a process of forming the PEOX to a thickness of 2.5K, wafer throughput was 42, 55.7, 62.4 and 67.8, respectively. Finally, in the case of a process of forming the PEOX to a thickness of 4K, the same results were obtained as described in Example 1.

As shown in Table 4, wafer throughput for the reaction chamber, as measured in wafers per hour, was highest when the reaction chamber cleaning 44 was performed after every 9 wafers, irrespective of whether the thickness of the formed thin film was 1K, 1.5K, 2.5K or 4K. Thus, in either of Examples 1 and 2, it was most preferable to perform the reaction chamber cleaning 44 after every 9 wafers.

Assuming 25 wafers in a wafer cassette, excluding the test wafer, and a multi-chamber system having 3 reaction chambers is used to form thin film, 9 wafers may be processed in each of two reaction chambers, and the remaining 7 wafers may then be processed in the third reaction chamber. Alternatively, 9 wafers may be processed in one chamber, and 8 wafers may be processed in each of the remaining two reaction chambers. Thus, even though it is preferred to perform the reaction chamber cleaning after every 9 wafers, some reaction chambers may not be able to process 9 wafers from a single wafer cassette. Accordingly, given the earlier opportunity of cleaning reaction chambers during an exchange of wafer cassettes, it is not preferable to strictly perform the cleaning cycle after 9 wafers.

Accordingly, reaction chamber cleaning in the present invention is preferably performed when 9 wafers are consecutively processed in the reaction chamber. However, reaction chamber cleaning may be opportunistically performed for a pertinent reaction chamber following fewer than 9 wafers. This is possible by improving the software controlling the timing of the cleaning process. Further, when thin film formation and reaction chamber cleaning is complete, the reaction chamber conditions are always returned to their initial stage. Thus the reaction chamber is ready for any new process, regardless of the specific recipe.

For example, assuming the system will perform a reaction chamber cleaning following 9 wafers, but that cleaning is possible for fewer than 9 wafers, further assuming fewer than 9 wafers are processed according to the 4K recipe, additional wafers may be processed, even though the recipe used for thin film formation changes from 4K to 1K, 1.5K or 2.5K. The "new" thin film forming process can be performed according to the 1K, 1.5K or 2.5K recipe directly after performing the reaction chamber cleaning 44.

As demonstrated in Table 3, the productivity of semiconductor devices in the case where the reaction chamber cleaning cycle is at least two wafers is much higher than that of the conventional 1× cycle. This is because the reaction chamber cleaning 44 is performed while the wafers are carried from the reaction chamber to the wafer cassette. Wafer processing does not occur in the reaction chamber until a new wafer is loaded from the wafer cassette into the reaction chamber after the wafer processed in the reaction chamber is carried to the wafer cassette.

Although the present examples have described formation of thin films on wafers in the reaction chamber, such as a plasma enhanced oxide film, a material film other than the plasma enhanced oxide film may be formed. Here, since the atmosphere of the reaction chamber differs, the items and data demonstrated in Tables 2 through 4 will change. The cycles for performing the reaction chamber cleaning may also change.

As described above, in a method of forming a thin film according to the present invention, a wafer is loaded from a wafer cassette into a reaction chamber and then the thin film is formed on the wafer. The cleaning of the reaction chamber is not performed whenever the process for forming the thin film is performed in the reaction chamber, but is performed after the thin film formation process is performed at least twice, preferably about 9 times, in the case of forming the thin film on each wafer. The cleaning of the reaction chamber is performed while wafers are carried between the reaction chamber and the wafer cassette. Since the cleaning can be performed any time after the thin film forming process is performed at least twice, a continuous processing is allowed without intermission even if the recipe changes in the course of the thin film forming process. Such a reaction chamber cleaning process is allowed by improving related software.

As described above, compared to the method for cleaning a reaction chamber for each wafer, the uniformity in thicknesses of a thin film is enhanced, and particles generated in the reaction chamber can be reduced, thereby improving the reliability of a semiconductor device. Also, since the wafer throughput per hour is increased, the productivity of semiconductor devices is enhanced.

The present invention is not limited to the above-described example. Various changes and modifications to the foregoing embodiments may be made by those skilled in the art without departing from the scope of the appended claims.

What is claimed is:

1. A method of forming a thin film on a plurality of wafers stored in a wafer cassette, the method comprising:
   (a) loading a first wafer from the wafer cassette into a reaction chamber;
   (b) forming a thin film on the first wafer;
   (c) returning the first wafer to the wafer cassette following formation of the thin film;
   (d) repeating (a) through (c) for at least a second wafer in the wafer cassette; and,
   (e) cleaning the reaction chamber;
   wherein the reaction chamber is a multi-reaction chamber containing three reaction chambers.

2. The method of claim 1, wherein the thin film formed on the first and second wafer is a plasma enhanced oxide film.

3. The method of claim 1, wherein (a) through (c) are repeatedly performed on nine wafers.

4. The method of claim 1, wherein (e) further comprises:
   establishing a first set flow; cleaning the reaction chamber; over-etching; performing a first purging; performing a first pumping; establishing a second set flow; performing a coating; performing a second purging; and performing a second pumping.

5. The method of claim 1, wherein (a) through (c) are performed 9 times in a first of the three reaction chambers, and thereafter performing (e); and
   wherein (a) through (c) are performed fewer than 9 times in a second and third of the three reaction chambers, and thereafter performing (e) for the second and third reaction chambers.

6. A method for forming a thin film on at least one wafer, the method comprising:
   loading a selected wafer from a wafer cassette into a reaction chamber;
   forming a thin film on the selected wafer;
   returning the selected wafer to the wafer cassette following formation of the thin film; and,
   cleaning the reaction chamber, wherein reaction chamber cleaning is performed fewer times than the number of wafers loaded into the wafer cassette;
   wherein forming a thin film on a selected wafer is consecutively performed from between 2 and 9 times before the reaction chamber is cleaned.

7. A method for forming a thin film on at least one wafer, the method comprising:

loading a selected wafer from a wafer cassette into a reaction chamber;

forming a thin film on the selected wafer;

returning the selected wafer to the wafer cassette following formation of the thin film; and, cleaning the reaction chamber, wherein reaction chamber cleaning is performed fewer times than the number of wafers loaded into the wafer cassette;

wherein the reaction chamber is a multi-reaction chamber containing three reaction chambers.

8. The method of claim 7, wherein forming a thin film is performed 9 times in a first chamber of the three reaction chambers, and thereafter the first reaction chamber is cleaned; and, forming a thin film is performed fewer than 9 times in a second and third chamber of the three reaction chambers, and thereafter the second and third reaction chambers are cleaned.

9. The method of claim 6, wherein the reaction chamber cleaning further comprises:

establishing a first set flow; cleaning the reaction chamber; over-etching; performing a first purging; performing a first pumping; establishing a second set flow; performing a coating; performing a second purging; and performing a second pumping.

* * * * *